(12) United States Patent
Harada et al.

(10) Patent No.: US 8,354,037 B2
(45) Date of Patent: Jan. 15, 2013

(54) HIGH-FREQUENCY MAGNETIC MATERIAL AND METHOD OF MANUFACTURING THE SAME

(75) Inventors: Kouichi Harada, Tokyo (JP); Tomohiro Suetsuna, Kanagawa (JP); Seiichi Suenaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 764 days.

(21) Appl. No.: 12/406,575

(22) Filed: Mar. 18, 2009

(65) Prior Publication Data

US 2009/0242826 A1 Oct. 1, 2009

(30) Foreign Application Priority Data

Mar. 28, 2008 (JP) ................................ 2008-085677

(51) Int. Cl.
*H01F 1/24* (2006.01)
(52) U.S. Cl. ............... 252/62.55; 252/62.54; 252/62.53; 428/539.5; 428/545; 977/777; 977/779; 977/838; 977/810; 977/783
(58) Field of Classification Search ............... 252/62.55, 252/62.54, 62.53; 977/777, 779, 838, 810, 977/783; 428/539.5, 545
See application file for complete search history.

(56) References Cited

U.S. PATENT DOCUMENTS

| 6,051,156 | A | 4/2000 | Yoshida et al. |
| 6,472,459 | B2 * | 10/2002 | Morales et al. ............... 524/439 |
| 2007/0102663 | A1 * | 5/2007 | Xiao et al. ............. 252/62.51 C |
| 2008/0029300 | A1 | 2/2008 | Harada et al. |
| 2008/0220231 | A1 | 9/2008 | Suetsuna et al. |
| 2008/0226899 | A1 | 9/2008 | Suetsuna et al. |

FOREIGN PATENT DOCUMENTS

| EP | 1 868 213 A1 | 12/2007 |
| JP | 10-106814 | 4/1998 |
| JP | 2004-128001 | 4/2004 |
| JP | 2005-5286 | 1/2005 |
| JP | 2006-97123 | 4/2006 |
| JP | 2006-176869 | 7/2006 |
| JP | 2007-8762 | 1/2007 |
| JP | 2008-24961 | 2/2008 |

OTHER PUBLICATIONS

Office Action issued Mar. 9, 2011, in Chinese Patent Application No. 200910130167.9 (with English translation).
Office Action issued Nov. 8, 2011, in Japanese Patent Application No. 2008-085677 (with English-language translation).
Susumu Tohno, "Aerosols and Fractal", Aerosol Research, vol. 7, No. 4, 1992, pp. 292-294.

* cited by examiner

*Primary Examiner* — Carol M Koslow
(74) *Attorney, Agent, or Firm* — Oblon, Spivak, McClelland, Maier & Neustadt, L.L.P.

(57) ABSTRACT

To provide a high-frequency magnetic material having a superior radio wave absorption property in a high frequency region and a method of manufacturing the same. The high-frequency magnetic material and the method of manufacturing the same includes a magnetic substance containing metal nanoparticles, the metal nanoparticles are magnetic metals containing at least one kind of Fe, Co, and Ni, an average particle diameter of the metal nanoparticles is equal to or less than 200 nm, first clusters having network-like structures with continuous metal nanoparticles and the average diameter equal to or less than 10 μm are formed, second clusters having network-like structures with the continuous first clusters and the average diameter equal to or less than 100 μm are formed, and the entire magnetic substance has a network-like structure with the continuous second clusters.

7 Claims, 2 Drawing Sheets

US 8,354,037 B2

HIGH-FREQUENCY MAGNETIC MATERIAL AND METHOD OF MANUFACTURING THE SAME

CROSS-REFERENCE TO RELATED APPLICATION

This application is based upon and claims the benefit of priority from Japanese Patent Application No. 2008-85677, filed on Mar. 28, 2008 the entire contents of which are incorporated herein by reference.

FIELD OF THE INVENTION

The present invention relates to a high-frequency magnetic material useful for magnetic parts used in a high-frequency range from 100 MHz to several gigahertz and a method of manufacturing the same.

BACKGROUND OF THE INVENTION

Recently, as application of magnetic substance, a use for radio wave absorbent attracts attention. For instance, in order to reduce radiation of noise from electronic equipment including cellular phone and computer, the magnetic loss of a magnetic substance is used.

The electromagnetic wave absorbent using the magnetic loss of a magnetic substance is located near a parts as a noise generation source for suppressing the radiation of noise. In this regard, it is known that the radio wave absorption property depends on the magnitude of the imaginary component $\mu''$ of complex magnetic permeability $\mu=\mu'-j\mu''$ of the magnetic substance, and the larger the magnitude of the imaginary component $\mu''$, the better property the magnetic substance has.

Such an electromagnetic wave absorbent using the magnetic substance includes a compact of mixture of the magnetic substance powder and a resin. For example, in an electromagnetic wave absorbent disclosed in JP-A 2004-128001 (KOKAI), the real component $\mu'$ and the imaginary component $\mu''$ of complex magnetic permeability $\mu$ are adjusted to satisfy $\mu'>\mu''$ and $\mu'\geqq 5$ in a particular frequency region within a high-frequency region of 1 to 3 GHz. Here, a radio wave absorbent is fabricated by assembling and aggregating many of at least one of (1) a magnetic powder having a chain-like structure of a large number of microspheres and (2) a microsphere magnetic substance powder under a condition that particles are individually insulated by electric insulating materials.

However, in the method, the magnetic substance powder particles are electrically insulated, and it is difficult to obtain a superior radio wave absorption property at a high frequency more than several hundreds of megahertz. Further, since the magnetic anisotropy of the used magnetic particles is small, there is similarly a limit in radio wave absorption at the high frequency.

In addition, in a method for radio wave absorption as shown in JP-A 10-106814 (KOKAI) or the like, flattened magnetic particles are used for providing magnetic anisotropy to the magnetic particles. Accordingly, the method can deal with the higher frequency. However, when the flattened magnetic particles are fabricated, there is a limit in size of the particles. On this account, the radio wave absorption property at a high frequency more than several hundreds of megahertz is low.

Moreover, JP-A 2007-8762 (KOKAI) discloses a magnetic substance better in plasticity because magnetic substance particles have a continuous network structure.

SUMMARY OF THE INVENTION

A high-frequency magnetic material according to an aspect of the present invention includes a magnetic substance containing metal nanoparticles, the metal nanoparticles are magnetic metals containing at least one kind of Fe, Co, and Ni, an average particle diameter of the metal nanoparticles is equal to or less than 200 nm, within the magnetic substance, first clusters having network-like structures with continuous metal nanoparticles and the average diameter equal to or less than 10 µm are formed, within the magnetic substance, second clusters having network-like structures with the continuous first clusters and the average diameter equal to or less than 100 µm are formed, and the magnetic substance has a network-like structure with the continuous second clusters.

A method of manufacturing a high-frequency magnetic material according to an aspect of the present invention includes forming metal nanoparticles, and compression molding the metal nanoparticles.

According to the present invention, a high-frequency magnetic material having a superior radio wave absorption property in a high frequency range and a method of manufacturing the same can be provided.

DETAILED DESCRIPTION OF THE EMBODIMENTS

Hereinafter, an embodiment of the present invention will be described using drawings.

A high-frequency magnetic material of the embodiment of the present invention includes at least a magnetic substance containing metal nanoparticles. These metal nanoparticles are magnetic metals containing at least one kind of Fe, Co, and Ni. The average particle diameter of the metal nanoparticles is equal to or less than 200 nm. Within the magnetic substance, first clusters having network-like structures with the continuous metal nanoparticles and the average diameter equal to or less than 10 µm are formed. Further, within the magnetic substance, second clusters having network-like structures with the continuous first clusters and the average diameter equal to or less than 100 µm are formed. The magnetic substance forms a network-like structure with the continuous second clusters.

Here, the case where the magnetic substance includes metal nanoparticles and dielectrics filling between these metal nanoparticles will be explained as an example.

Figure 1A:
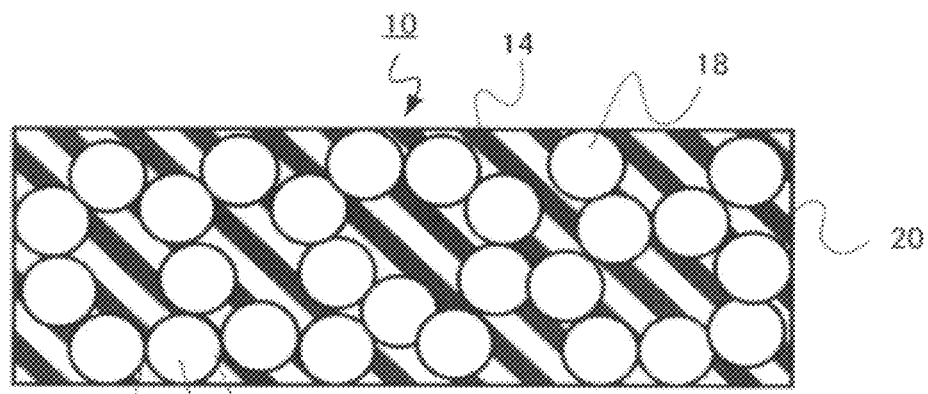
FIGS. 1A to 1C are sectional conceptual views of a high-frequency magnetic material of an embodiment.
Figure 1B:
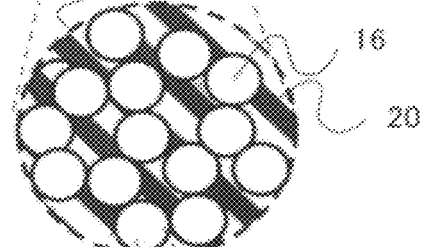
Figure 1C:
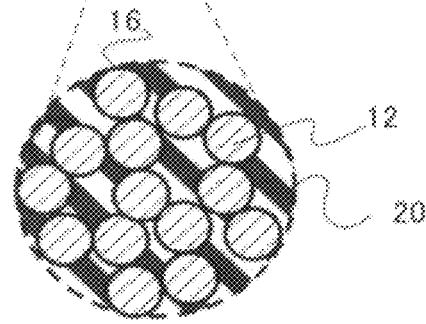

FIGS. 1A to 1C are conceptual sectional views of the high-frequency magnetic material of the embodiment. FIG. 1A is an overall sectional view, FIG. 1B is a sectional view of the second cluster, and FIG. 1C is a sectional view of the first cluster. As shown in FIGS. 1A to 1C, the high-frequency magnetic material includes a magnetic substance 14 containing metal nanoparticles 12 on a substrate (not shown), for example.

The metal nanoparticles 12 have an average particle diameter equal to or less than 200 nm, and are magnetic metals containing at least one kind of Fe, Co, and Ni. The metal nanoparticles 12 gather to form first clusters 16 having an average diameter equal to or less than 10 μm. As shown in FIG. 1C, the first cluster 16 has a network-like structure in which parts of individual metal nanoparticles 12 forming the cluster are continuous in contact or junction with one another.

Further, the first clusters 16 gather to form a second clusters 18 having an average diameter equal to or less than 100 μm. As shown in FIG. 1B, the second cluster 18 has a network-like structure in which parts of individual first clusters 16 forming the cluster, more microscopically, the metal nanoparticles 12 on the circumference of the first clusters 16 are continuous in contact or junction with one another.

Parts of the second clusters 18, more microscopically, parts of the metal nanoparticles 12 on the circumference of the second clusters 16 are in contact or junction with one another to form a network-like structure within the magnetic substance 14, as shown in FIG. 1A.

The high-frequency magnetic material 10 is configured by the network structures within the first clusters 16, the network structures within the second clusters 18, and the network structure within the magnetic substance 14 formed by the second clusters 18 themselves. As described above, the high-frequency magnetic material 10 includes a so-called fractal (self-similar) three-dimensional network structure.

Figure 2A:
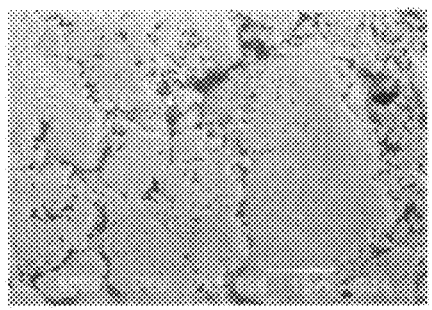
FIGS. 2A and 2B are SEM photographs of the high-frequency magnetic material of the embodiment.
Figure 2A:
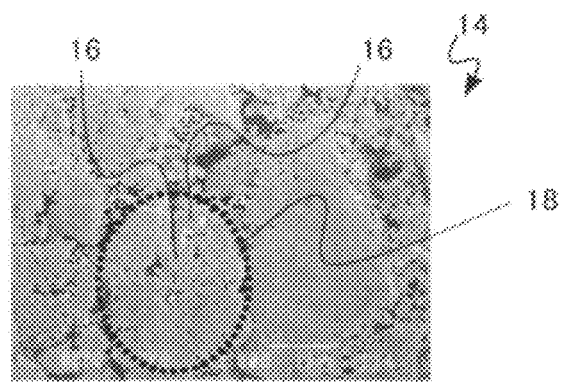
Figure 2B:
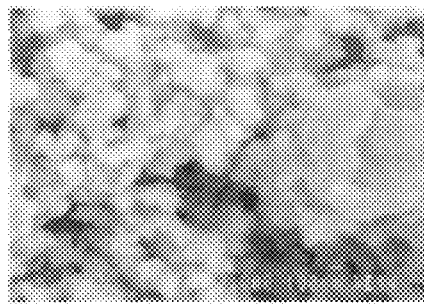
Figure 2B:
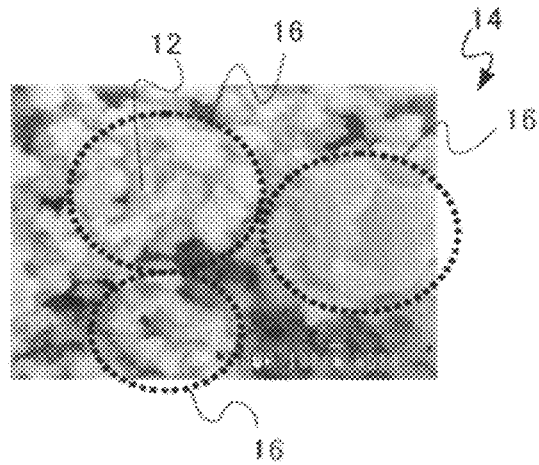

FIGS. 2A and 2B are SEM photographs of the high-frequency magnetic material of the embodiment. FIG. 2A shows photographs at 2K× magnification, and FIG. 2B shows photographs at 40K× magnification. The photographs in FIGS. 2A and 2B are the same photographs except that the right photographs have markings, respectively. As shown in FIG. 23, the metal nanoparticles 12 are connected in a network-like manner to form the first clusters 16. Further, from observation at the low magnification, as shown in FIG. 2A, the first clusters 16 are connected in a network-like manner to form the second clusters 18. Furthermore, the second clusters 18 are connected in a network-like manner to form the magnetic substance 14.

The high-frequency magnetic material 10 of the embodiment has the above structure, and thereby, a superior radio wave absorption property can be realized in a high-frequency region. Such a superior radio wave absorption property can be realized in a high-frequency region by the fractal (self-similar) three-dimensional network structure of the metal nanoparticles because of the high magnetic loss due to the high $\mu''$ in the high-frequency region and the high conductive loss due to the network structure.

Here, the magnetic metals contained in the metal nanoparticles contain at least one kind of Fe, Co, and Ni, and, of them, Fe-base alloy, Co-base alloy, and FeCo-base alloy that can realize high saturated magnetization are particularly preferable. The Fe-base alloy and Co-base alloy include FeNi alloy, FeMn alloy, FeCu alloy, FeMo alloy, FeCr alloy, CoNi alloy, CoMn alloy, CoCu alloy, CoMo alloy, and CoCr alloy containing Ni, Mn, Cu, Mo, and Cr as the second component. The FeCo-base alloy includes alloys containing Ni, Mn, Cu, Me, and Cr as the second component. These second components are effective for improvement in magnetic permeability.

Further, the metal nanoparticles may be polycrystal particles or single-crystal particles. In the case of single-crystal particles, the axes of easy magnetization can be aligned when the particles are aggregated. On this account, the magnetic anisotropy can be controlled, and the sharp absorption property can be realized at higher frequencies. On the other hand, in the case of polycrystal particles, there are advantages that they can be easily synthesized, and the magnetic resonance frequency band can be made broader and the absorption band can be made broader as well. Selection of particles to be used preferably depends on whether the sharp absorption property or the broad absorption property is desired.

The metal nanoparticles preferably have the average particle diameter from 1 nm to 200 nm, and especially preferable from 10 nm to 50 nm. If the particle diameter is less than 10 nm, super paramagnetism may occur and the flux content may be insufficient. On the other hand, if the particle diameter is larger, the eddy-current loss is larger in the high-frequency region and the intended magnetic property in the high-frequency region is lower. That is, the resonance frequency shifts to the low-frequency side and the imaginary component $\mu''$ at the high frequency is smaller.

Further, if the particle diameter is larger, the condition is energetically more stable with the single-domain structure than with the multi-domain structure. In this regard, the high-frequency property of the magnetic permeability of the multi-domain structure becomes worse than the high-frequency property of the magnetic permeability of the single-domain structure. That is, the resonance frequency shifts to the low-frequency side and the imaginary component $\mu''$ at the high frequency is smaller. Therefore, when the metal nanoparticles are used as magnetic members for high frequency, they are preferably particles having the single-domain structures.

Since the limit particle diameter that can hold the single-domain structure is about 50 nm or less, the particle diameter is more desirably set to 50 nm or less. As described above, the average particle diameter of the metal nanoparticles is preferably from 1 nm to 200 nm, and especially preferable in a range from 10 nm to 50 nm.

In addition, the metal nanoparticles may be spherical particles, and preferably flattened particles or rod-like particles having large aspect ratios. When the aspect ratios are made larger, the magnetic anisotropy due to their shapes can be provided, and not only the high-frequency property of the magnetic permeability is improved but also the particles are easily oriented by the magnetic field when the particles are aggregated to fabricate the members. By the orientation, the high-frequency property of the magnetic permeability is further improved. That is, the resonance frequency further shifts to the high-frequency side and the imaginary component $\mu''$ at the high frequency is larger.

Further, when the aspect ratio is made larger, the limit particle diameter forming the single-domain structure can be made larger and the high-frequency property of the magnetic permeability is not deteriorated even with the large particles. If the particles are spherical, the limit particle diameter forming the single-domain structure is about 50 nm, however, when the particles are the flattened particles having large aspect ratios, the limit particle diameter is larger. Generally, particles having larger particle diameters are more easily synthesized, and therefore, the larger aspect ratio is more advantageous in view of manufacturing.

Furthermore, it is preferable that the filling rate of the magnetic metal nanoparticles can be made larger by increasing the aspect ratio when the particles are aggregated to fabricate members, and thereby, the saturated magnetization per volume, per weight of the members can be made larger. Thus, also the magnetic permeability can be made larger. That is, when $\mu'$ becomes larger, $\mu''$ becomes larger accordingly.

The average diameter of the first clusters is equal to or less than 10 μm and the average diameter of the second clusters is equal to or less than 100 μm because the resistivity of the magnetic substance can be made from 1 mΩ·cm to 10 kΩ·cm, and thereby, the high conductive loss, i.e., the high radio wave absorption property can be obtained in the high-frequency region. Further, at the same time, the imaginary component $\mu''$ of the magnetic permeability can be made higher in the high-frequency region, and thereby, the high magnetic loss, i.e., the high radio wave absorption property can be obtained.

The above description is summarized as follows. When the average diameter of the first clusters is equal to or less than 10 μm and the average diameter of the second clusters is equal to or less than 100 μm, the high conductive loss and the high magnetic loss can be realized at the same time in the high-frequency region, and thereby, the superior radio wave absorption property can be realized.

It is desirable that the crystal magnetic anisotropy of the metal nanoparticles is equal to or more than $23.9 \times 10^3$ A/m ($\approx 300$ Oe). This is because the resonance frequency is located at the high-frequency side, and thereby, the imaginary component $\mu''$ at the high frequency is larger and the high-frequency absorption property is better.

Here, it is desirable that at least some of the metal nanoparticles are coated with oxide. That is, it is desirable that core-shell type particles are formed with the metal nanoparticles as cores and the oxide as shells. It is more desirable that the oxide coating layer coating the part of the surface of the metal nanoparticle is oxide or composite oxide containing one or more metals as constituents of the metal nanoparticle.

This is because, when the oxide coating layer is oxide or composite oxide containing one or more metals as constituents of the metal nanoparticle, the adhesion and bonding property between the metal nanoparticles and the oxide coating layers are better and thermally stable materials are formed.

The oxide coating layer cannot only improve the oxidation resistance of the inside metal nanoparticles but also electrically separate the metal nanoparticles when the particles are aggregated to fabricate the members and increase the electric resistance of the members. By increasing the electric resistance of the members, the eddy-current loss at the high frequency can be suppressed and the high-frequency property of the magnetic permeability can be improved. That is, the peak of the imaginary component $\mu''$ shifts to the high-frequency side, and the imaginary component $\mu''$ at the high frequency is larger.

For the purpose, the oxide coating layer is necessary to have electrically high resistance, and preferably equal to or more than 1 mΩ·cm. It is preferable that surface of the metal nanoparticles are partially coated with oxide. In this case, since the metal nanoparticles have the insulating coating layers not on the entire surfaces but only in parts, the networks with the appropriate resistance held can be formed stable even when the particles are in contact with or coupled to one another.

It is desirable that the metal nanoparticle having the oxide coating layers contain non-magnetic metals and the oxide coating layers contain at least one kind of the non-magnetic metals. The non-magnetic metal is desirably at least one ore more metals selected from Mg, Al, Si, Ca, Zr, Ti, Hf, rare-earth element, Ba, and Sr.

These non-magnetic metals are elements oxides of which have low standard Gibbs free energy of formation and easily oxidized. The elements are preferable in view of the stability in insulation property of the oxide coating layers coating the metal nanoparticles. In other words, metals having high standard Gibbs free energy of formation are not preferable because they are hard to be oxidized. Further, when the oxide coating layer is oxide or composite oxide containing one or more metals as constituents of the metal nanoparticle, the adhesion and bonding property between the metal nanoparticles and the oxide coating layers are better and thermally stably materials are formed.

In this regard, Al and Si are especially preferable in view of thermal stability of the metal nanoparticles because they are easily solid-soluble with Fe, Co, and Ni as main components of the metal nanoparticles. That is, the oxide coating layer more preferably includes oxide containing Al or Si. The oxide coating layer may include one kind of oxide or composite oxide as mixture (including solid solution) of several kinds of oxides.

It is desirable that the thickness of the oxide coating layer is from 0.1 nm to 100 nm. It is undesirable that the thickness is less than 0.1 nm because the oxidation resistance is insufficient and the resistance of the members is reduced when the particles are aggregated to fabricate the members and the eddy-current loss easily occurs, and thereby, the imaginary component $\mu''$ of the magnetic permeability at the high frequency is smaller.

Further, it is also undesirable that the thickness is more than 100 nm because the filling rate of the magnetic metal nanoparticles contained in the members is reduced when the particles are aggregated to fabricate the members and the saturated magnetization of the members is reduced, and thereby, the imaginary component $\mu''$ is smaller. The thickness of the oxide coating layer that is effective for preventing reduction in the imaginary component $\mu''$ at the high frequency by suppressing the eddy-current loss and reduction in the imaginary component $\mu''$ by not greatly reducing the saturated magnetization is a thickness from 0.1 nm to 100 nm.

It is desirable that the metal nanoparticle contains at least one of C (carbon) and N (nitrogen). The particle may contain only one or both of carbon and nitrogen. The carbon and nitrogen are effective elements that can be solid-solved with the magnetic metal to increase magnetic anisotropy. A material having great magnetic anisotropy can increase the ferromagnetic resonance frequency ($\mu'$ of the material largely decreases and $\mu''$ largely increases near the ferromagnetic resonance frequency), and therefore, the material can be used in the high-frequency band.

It is desirable that all of the contents of the non-magnetic metal, carbon, and nitrogen contained in the metal nanoparticle are equal to or less than 20 at % relative to the magnetic metal. The greater contents are not preferable because they reduce the saturated magnetization of the metal nanoparticles (the imaginary component $\mu''$ becomes smaller).

Further, it is preferable that the magnetic metal, the non-magnetic metal, and at least one of carbon and nitrogen contained in the metal nanoparticle are solid-solved. By the solid solution, the magnetic anisotropy can be effectively improved, and thereby, the high-frequency magnetic property can be improved, that is, the imaginary component $\mu''$ can be made larger. Additionally, the mechanical characteristics of the material can be improved. If they are not solid-solved, they are segregated at the grain boundary and the surface of the metal nanoparticle, the magnetic anisotropy or mechanical characteristics can not effectively be improved.

The dielectrics 20 are not particularly limited but generally a resin. Specifically, a polyester resin, polyethylene resin, polystyrene resin, polyvinyl chloride resin, polyvinyl butyral resin, polyurethane resin, cellulose resin, ABS resin, nitrile-butadiene rubber, styrene-butadiene rubber, epoxy resin, phenol resin, amide resin, imide resin, or copolymer of them are used.

Alternatively, the dielectrics may include an inorganic material such as oxide, nitride, or carbide. Specifically, $Al_2O_3$, AlN, $SiO_2$, SiC, and the like are examples.

It is preferable that, in order to improve radio wave absorption property, the dielectrics 20 of the embodiment has a larger imaginary component of the complex permittivity in the radio wave absorption region to be needed. Further, the dielectrics of the embodiment may be mixture of the above cited resin and inorganic material, and may be formed by dispersing $Al_2O_3$ in epoxy resin.

It is desirable that the spaces between metal nanoparticles are filled with the dielectrics for using the dielectric loss, however, the dielectrics is not an essential element and the spaces between metal nanoparticles may be vacant.

If the spaces between metal nanoparticles are filled with the dielectrics, the dielectric loss due to distortion at the interface between metal particles and dielectrics and the dielectric loss due to generation of capacity components because the metal nanoparticles function as electrodes are caused, and the dielectric loss can be made larger than that in the case of vacancy. By the dielectric loss, the radio wave absorption property can be further improved.

In addition, it is especially desirable that the resistivity of the magnetic substance is from 1 mΩ·cm to 100 kΩ·cm, and particularly from 10 mΩ·cm to 10 kΩ·cm, and the real component $\mu'$ of the complex magnetic permeability of the magnetic substance is equal to or more than three at 1 GHz. By satisfying all of these conditions, the extremely high radio wave absorption property can be realized in the high-frequency range.

In the high-frequency magnetic material according to the embodiment, the material organization can be discriminated or analyzed by SEM (Scanning Electron Microscopy) and TEM (Transmission Electron Microscopy), the diffraction pattern (including confirmation of solid solution) by TEM-Diffraction, XRD (X-ray Diffraction), the identification and quantitative analysis of constituent elements by ICP (Inductively coupled plasma) emission spectrometry, fluorescent X-ray spectroscopy, EPMA (Electron Probe Micro-Analysis), EDX (Energy Dispersive X-ray Fluorescence Spectrometer), or the like, respectively.

Further, the average particle diameter of the metal nanoparticles is obtained by averaging many particle diameters that are determined by averaging the longest diagonal lines and the shortest diagonal lines of the individual particles in TEM observation and SEM observation. The average diameters of the first clusters and the second clusters are obtained by averaging many cluster diameters that are determined by averaging the longest diagonal lines and the shortest diagonal lines of the individual clusters in TEM observation and SEM observation.

Next, a method of manufacturing the high-frequency magnetic material of the embodiment will be described. The method of manufacturing the high-frequency magnetic material of the embodiment is characterized by having the metal nanoparticle forming step of forming metal nanoparticles, the mixing step of mixing the metal nanoparticles and a resin, and the compression molding step of compression molding the metal nanoparticles.

First, for example, plasma is generated by introducing an argon gas for plasma generation into a high-frequency-induced thermal plasma device. Within the device, for example, metal nanoparticles of Fe—Al alloy are formed by using Fe powder and Al powder as raw materials and spraying argon gas thereto as a carrier gas. For formation of the metal nanoparticles, not limited to the method but also a method of precipitating target metal nanoparticles in a solution using chemical reaction may be used. Alternatively, a method of capturing the target metal evaporated in the nonvolatile solution as nanoparticles and collecting them may be used.

The obtained metal nanoparticles are mixed with a resin, for example. Further, the mixture is compressed and compacted to form the high-frequency magnetic material. Specifically, the compression molding is performed by, uniaxial pressing, CIP, HIP, or the like. More specifically, for example, a method of mixing acetone, PVB, and the metal nanoparticles, and then, drying, granulating, and putting them in a mold, and then, compression molding by a uniaxial oil press and taking out them is used.

In this manner, the high-frequency magnetic material of the embodiment can be manufactured.

Note that the mixing step of mixing the metal nanoparticles and a resin is not necessarily essential. When the high-frequency magnetic material with vacant spaces between metal nanoparticles is formed, the step can be omitted.

Further, when the magnetic substance is formed by coreshell type nanoparticles with cores of the metal nanoparticles and shells of oxide, the step of coating surface of the metal nanoparticles with oxide is added after the metal nanoparticles forming step and before the compression molding step. It is preferable to coat the surface partially not entirely.

As above, the embodiment of the present invention has been described with reference to specific examples. The above embodiment is only an example and does not limit the present invention. Further, in the description of the embodiment, in the high-frequency magnetic material and the method of manufacturing the same, the parts that are directly unnecessary for the description of the present invention have been omitted, however, necessary elements related to the high-frequency magnetic material and the method of manufacturing the same can appropriately be selected and used.

All of other high-frequency magnetic materials and the methods of manufacturing the same that have the elements of the present invention and can be changed in design by those skilled in the art are included in the scope of the present invention. The scope of the present invention is defined by the claims and their equivalents.

EXAMPLES

As below, examples as specific examples of the present invention will be described in detail in comparison with a comparative example. The method of measuring the average crystal particle diameters of metal nanoparticles in the following examples 1 and 1' to 3 is based on TEM observation.

Specifically, the average particle diameter is obtained by averaging particle diameters that are determined by averaging the longest diagonal lines and the shortest diagonal lines of the individual particles shown in observation (photographs). The photographs are taken at three or more locations in unit area of 10 μm×10 μm and the average value is obtained. The evaluation of the composition analysis of the microstructure is centered on the EDX analysis. Further, the average diameters of the first clusters and the second clusters are obtained by averaging cluster diameters that are determined by averaging the longest diagonal lines and the shortest diagonal lines of the individual clusters in SEM observation. The measurement is performed on the total ten clusters of five first clusters and five second clusters in SEM images in two visual fields and the average values are obtained.

Example 1

Plasma is generated by introducing an argon gas for plasma generation at 40 L/min into a high-frequency-induced thermal plasma device. Metal nanoparticles of Fe—Al alloy having the average particle diameter of 40 nm are obtained by using Fe powder and Al powder as raw materials and spraying the argon gas thereto as a carrier gas at 3 L/min. The particles are mixed with PVB at a ratio of 100:10 and compacted by uniaxial pressing to form a high-frequency magnetic material of the example 1.

Example 1'

Plasma is generated by introducing an argon gas for plasma generation at 40 L/min into a high-frequency-induced thermal plasma device. Using Fe powder and Al powder as raw materials and the argon gas is sprayed thereto as a carrier gas at 3 L/min. Simultaneously, methane is introduced as a raw material of carbon coating into the carrier gas, and metal nanoparticles of carbon coated Fe—Al alloy are obtained.

Core-shell type particles are fabricated by reducing the carbon-coated Fe nanoparticles at 650° C. under hydrogen flow at 500 cc/min, and then, cooling the particles to the room temperature and taking out them in the argon with 0.1 vol % of oxygen. The fabricated core-shell type particles have structures having the average particle diameter of 32 nm of the magnetic metal nanoparticles as cores and thicknesses of oxide coating layers of 4 nm.

The magnetic metal nanoparticles as cores include Fe—Al—C, and the oxide coating layers include Fe—Al—C. The core-shell type particles and the epoxy resin are aggregated by mixing them at a ratio of 100:10 and compacted by uniaxial pressing to form a high-frequency magnetic material of the example 1'.

Example 2

In place of carbonization in the example 1, nitriding is performed to fabricate core-shell type particles. The fabricated core-shell type particles have structures having the average particle diameter of 41 nm of the magnetic metal nanoparticles as cores and thicknesses of oxide coating layers of 4 nm.

The magnetic metal nanoparticles as cores include Fe—Al—N, and the oxide coating layers include Fe—Al—O. The core-shell type particles and the epoxy resin are aggregated by mixing them at a ratio of 100:10 and compacted by uniaxial pressing to form a high-frequency magnetic material of the example 2.

Example 3

In the example 1, Fe powder and Si powder as raw materials are sprayed in plasma. The fabricated core-shell particles have structures having the average particle diameter of 38 nm of the magnetic metal nanoparticles as cores and thicknesses of oxide coating layers of 3 nm.

The magnetic metal nanoparticles as cores include Fe—Si—C, and the oxide coating layers include Fe—Si—O.

The core-shell type particles and the resin are mixed and compacted at a ratio of 100:10 to form a high-frequency magnetic material of the example 3.

From SEM observation of the compacts of the examples 1, 1' to 3, it is known that the metal nano primary particles gather to be first clusters and the first clusters further gather to form the second clusters, and thereby, the compacts are formed. The metal nanoparticles are partially in contact with one another to form a network, and the first clusters and the second clusters form networks with one another.

Comparative Example 1

In the example 1, magnetic particles and PVB are formed in the same composition as that of the example 1 using the doctor blade method in place of compression molding to form a high-frequency magnetic material of the comparative example 1. From SEM observation of the comparative example 1, the networks of the secondary particles as seen in the examples 1, 1' to 3 are not observed.

The overview of the obtained high-frequency magnetic materials in the examples 1, 1' to 3 and the comparative example 1 is shown in the following table 1. Further, the radio wave absorption properties are investigated on the evaluation samples of the examples 1, 1' to 3 and the comparative example 1 in the following manner. The results are shown in the table 1.

(Evaluation of Radio Wave Absorption Property)

Onto an electromagnetic wave application surface of an evaluation sample and the opposite surface, metal thin plates of 1 mm in thickness and in the same area are bonded, the radio wave absorption property is measured by reflected power method in a free space using S11 mode of a sample network analyzer at electromagnetic wave of 2 GHz. The reflected power method is to measure how much decibel the reflection level from the sample decreases in comparison with the reflection level of the metal thin plate (complete reflection) to which no sample is bonded. The amount of absorption of electromagnetic wave is defined by the amount of attenuated reflection based on the measurement and obtained as a relative value when the amount of absorption of the comparative example 1 is assumed to be one.

TABLE 1

| | Radio Wave Absorption Property | | | | | | | | |
|---|---|---|---|---|---|---|---|---|---|
| | 300 MHz | 500 MHz | 1 GHz | 2 GHz | μ' | Resistivity (mΩ·cm) | Magnetic Anisotropy (kOe) | Average Diameter of First Clusters (μm) | Average Diameter of Second Clusters (μm) |
| Example 1 | 2 | 2.7 | 3.9 | 2.8 | 3 | 1 | 1.2 | 1.2 | 24 |
| Example 1' | 2 | 3.5 | 4.4 | 3 | 3 | 1k | 1.2 | 1.3 | 22 |
| Example 2 | 2 | 4.5 | 4.7 | 3.3 | 3 | 1k | 1.2 | 1.2 | 23 |
| Example 3 | 2 | 4.4 | 5 | 3.2 | 3 | 1k | 1.2 | 1.4 | 25 |
| Comparative Example 1 | 1 | 1 | 1 | 1 | 2 | 100k | 1.1 | — | — |

As clearly known from the table 1, in the high-frequency magnetic materials according to the examples 1, 1' to 3, high radio wave absorption properties are exhibited in the high-frequency regions.

As described above, the advantage of the present invention has been confirmed from the example.

What is claimed is:

1. A high-frequency magnetic material comprising a magnetic substance containing metal nanoparticles,
   wherein the metal nanoparticles are magnetic metals containing at least one kind of Fe, Co, and Ni, an average particle diameter of the metal nanoparticles is equal to or less than 200 nm, within the magnetic substance, first clusters having network-like structures with continuous metal nanoparticles and the average diameter equal to or less than 10 μm are formed, within the magnetic substance, second clusters having network-like structures with the continuous first clusters and the average diameter equal to or less than 100 μm are formed, the magnetic substance has a network-like structure with the continuous second clusters, and surface of the metal nanoparticles are partially coated with oxide.

2. The material according to claim 1, wherein spaces between the metal nanoparticles are filled with dielectrics.

3. The material according to claim 1, wherein the metal nanoparticles contain non-magnetic metals, and the oxide contains at least one kind of non-magnetic metal of the non-magnetic metals.

4. The material according to claim 1, wherein the metal nanoparticles contain at least one of C (carbon) and N (nitrogen).

5. The material according to claim 1, wherein magnetic anisotropy of the metal nanoparticles is equal to or more than $23.9 \times 10^3$ A/m.

6. The material according to claim 1, wherein resistivity of the magnetic substance is from 1 mΩ·cm to 100 kΩ·cm, and a real component μ' of complex magnetic permeability of the magnetic substance is equal to or more than three at 1 GHz.

7. A high-frequency magnetic material comprising a magnetic substance containing metal nanoparticles, wherein the metal nanoparticles are magnetic metals containing at least one kind of Fe, Co, and Ni, an average particle diameter of the metal nanoparticles is equal to or less than 200 nm, within the magnetic substance, first clusters having network-like structures with continuous metal nanoparticles and the average diameter equal to or less than 10 μm are formed, within the magnetic substance, second clusters having network-like structures with the continuous first clusters and the average diameter equal to or less than 100 μm are formed, the magnetic substance has a network-like structure with the continuous second clusters, and spaces between the metal nanoparticles are filled with dielectrics, surface of the metal nanoparticles are partially coated with oxide, the metal nanoparticles contain non-magnetic metals, the oxide contains at least one kind of non-magnetic metal of the non-magnetic metals, and the metal nanoparticles contain at least one of C (carbon) and N (nitrogen).

* * * * *